(12) United States Patent
Zheng et al.

(10) Patent No.: US 6,990,327 B2
(45) Date of Patent: Jan. 24, 2006

(54) WIDEBAND MONOLITHIC TUNABLE HIGH-Q NOTCH FILTER FOR IMAGE REJECTION IN RF APPLICATION

(75) Inventors: Yuanjin Zheng, Singapore (SG); Sheng Jau Wong, Johor Bahru (MY); Yong Xu, Singapore (SG)

(73) Assignee: Agency for Science Technology and Research, Singapore (SG)

( * ) Notice: Subject to any disclaimer, the term of this patent is extended or adjusted under 35 U.S.C. 154(b) by 422 days.

(21) Appl. No.: 10/426,426

(22) Filed: Apr. 30, 2003

(65) Prior Publication Data

US 2004/0219900 A1 Nov. 4, 2004

(51) Int. Cl.
*H04B 1/10* (2006.01)
(52) U.S. Cl. .................. 455/307; 455/333; 333/195
(58) Field of Classification Search ........... 455/302, 455/307, 323, 333; 333/175, 176, 195
See application file for complete search history.

(56) References Cited

U.S. PATENT DOCUMENTS

| | | | | |
|---|---|---|---|---|
| 4,327,332 | A * | 4/1982 | Malchow | 330/261 |
| 5,625,307 | A | 4/1997 | Scheinberg | 327/113 |
| 5,737,035 | A | 4/1998 | Rotzoll | 348/725 |
| 6,072,376 | A | 6/2000 | Matsuyoshi et al. | 333/134 |
| 6,127,962 | A | 10/2000 | Martinson | 342/20 |
| 6,177,964 | B1 | 1/2001 | Birleson et al. | 348/725 |
| 6,285,865 | B1 | 9/2001 | Vorenkamp et al. | 455/307 |
| 6,351,502 | B1 | 2/2002 | Zargari | 375/324 |
| 6,374,094 | B1 | 4/2002 | Zappala | 455/188.1 |
| 6,661,301 | B2 * | 12/2003 | Traub | 331/117 R |
| 2001/0008430 | A1 | 7/2001 | Carr et al. | 348/725 |
| 2002/0173287 | A1 * | 11/2002 | Rogers et al. | 455/307 |
| 2003/0030393 | A1 * | 2/2003 | Morishita et al. | 318/254 |

OTHER PUBLICATIONS

J. Crols et al., CMOS Wireless Transceiver Design, Kluwer Academic Publishers, 1997, pp. 13-19, 63-66.
T.H. Lee, The Design of CMOS Radio—Frequency Integrated Circuits, U.K. : Cambridge Univ. Press, 1998, pp. 550-559.
B. Razavi, RF Microelectronics, NJ: Prentice Hall, 1998, pp. 122-129, 138-143.
J. Crols et al., "A Single-Chip 900 MHz CMOS Receiver Front-End with a High Performance Low-IF Topology", IEEE Journal of Solid State Circuits, vol. 30, No. 12, pp. 1483-1492, Dec. 1995.

(Continued)

*Primary Examiner*—Nguyen T. Vo
*Assistant Examiner*—Nhan T. Le
(74) *Attorney, Agent, or Firm*—George O. Saile; Stephen B. Ackerman

(57) ABSTRACT

A notch filter with a high Q factor, which is integrated with a first and a second cascoded LNA, is totally contained on an integrated chip. The notch filter, comprising two Q-enhancement circuits, is coupled to the second differential LNA. The two Q-enhancement circuits are combined to generate sufficient negative impedance to compensate for the loss in the on-chip low Q inductors. To improve the image rejection of the notch filter in a wide frequency band, the notch filter uses an automatic current tuning circuit which consists of an analog multiplier and fixed and voltage controlled current sources. Furthermore, by modifying the connection and location of the tunable varactor, another wideband tunable notch filter is implemented. The notch filter can be applied in all current wireless receiver systems.

48 Claims, 14 Drawing Sheets

OTHER PUBLICATIONS

Chunbing Guo et al., "A Monolithic 2-V 950-MHz CMOS Bandpass Amplifier With a Notch Filter for Wireless Receivers," IEEE Radio Frequency Integrated Circuits Symp., 2001, pp. 79-82.

Yuyu Chang et al., "An Inductorless Active Notch Filter for RF Image Rejection," Proc. IEEE Int. Symp. on Circuits and Systems, 1999, pp. 166-169.

H. Samavati et al., "A 5-GHz CMOS Wireless LAN Receiver Front End," IEEE Jrnl. of Solid State Circuits, vol. 35, No. 5, May 2000, pp. 765-772.

M.H. Koroglu et al., "LC Notch Fiter for Image—Reject Applications Using On-Chip Inductors," Electronics Letters, Mar. 1, 2001, vol. 37, No. 5, pp. 267-268.

J. Macedo et al., "A 2.5 GHz Monolithic Silicon Image Reject Filter," IEEE 1996 Custom Integrated Circuits Conference, pp. 193-196.

J.W.M. Rogers et al., "A Completely Integrated 1.8 Volt 5 GHz Tunable Image Reject Notch Filter," IEEE Radio Frequency Integrated Circuits Symp., 2001, pp. 75-78.

* cited by examiner

FIG. 1a – Prior Art

WIDEBAND MONOLITHIC TUNABLE HIGH-Q NOTCH FILTER FOR IMAGE REJECTION IN RF APPLICATION

BACKGROUND OF THE INVENTION

1. Field of the Invention

The invention relates to high performance wireless transceiver circuits, and more particularly to an on-chip bandstop and bandpass CMOS filter fully integrated into one unit where all inductors are integrated on the chip.

2. Description of the Related Art

With the growing market in wireless communications, high performance wireless transceiver chips are required to meet the demand of high data rate and wide-band services. This development has driven the wireless industry to develop new design techniques for the transceiver. Architectures such as low intermediate frequency (IF) receivers and zero-IF (direct conversion) receivers have been proposed to overcome problems in classical superheterodyne receivers. Refer to J. Crols and M. Steyaert, *CMOS Wireless Transceiver Design*, Kluwer Academic Publishers, 1997, pp. 13–19, and pp. 63–66;

T. H. Lee, *The Design of CMOS Radio-Frequency Integrated Circuits*, U.K.: Cambridge Univ. Press, 1998, pp. 550–559;

B. Razavi, *RF Microelectronics*, NJ: Prentice Hall, 1998, pp. 122–129, 138–143;

J. Crols and M. Steyaert, "A Single-Chip 900 MHz CMOS Receiver Front-End with a High Performance Low-IF Topology," IEEE Journal of Solid State Circuits, vol. 30, no. 12, pp. 1483–1492, December 1995.

The low IF architecture in J. Crols and M. Steyaert, *CMOS Wireless Transceiver Design*, and "A single-chip 900 MHz CMOS receiver front-end with a high performance low-IF topology" as referenced above, combines the advantages of both the superheterodyne and the zero-IF receiver. It can achieve good performance as well as high degree of integration. The main problem of the low IF receiver is the difficulty to attain high image rejection. Although complex filters and/or polyphase filters have been invented to reject the image signal in low IF receivers, the image rejection ratio (IRR) provided by these methods is very sensitive to I/Q amplitude imbalance and phase mismatch of the receiver path. As a result, the current low IF receivers only can attain about 30–40 dB image rejection.

The direct conversion architecture in T. H. Lee, *The Design of CMOS Radio-Frequency Integrated Circuits*, and B. Razavi, *RF Microelectronics*, as referenced above, alleviates the problem of image rejection and has good performance with a small noise figure, high linearity and low complexity. However, it possesses some other serious problems such as DC offset, flicker noise, IP2 nonlinear distortion, and so on.

The superheterodyne receiver perhaps is the most commonly used transceiver architecture in wireless industry. As illustrated in FIG. 1a (prior art), it normally includes a bandpass filter(BPF) 11, a low noise amplifier (LNA) 12, an image rejection filter (IMR-F) 13, also called a notch filter, and a downconversion mixer 14 in the RF band. In most RF applications the image signal can be over 60 dB higher than the desired RF signal, so the overall image rejection ratio (IRR) must be 60 to 70 dB as per B. Razavi, *RF Microelectronics*, above, to make the receiver function properly. Due to unavoidable process and temperature variations, the current integrated image rejection mixer only can attain about 30 dB of image rejection. The other 30–40 dB of image rejection has to be done by employing an RF image rejection filter between the LNA and mixer. The current RF filters used for band selection and image rejection are mainly off-chip filters like ceramic and SAW filters, these types of filters are usually bulky and very costly, furthermore, they are not integratable and consume more power. Moreover, they need impedance matching both at the input and output to work well. These extra constraints have to be imposed on the preceding LNA design and the following mixer design.

To solve these problems, and to achieve a fully integrated, low cost, low power and single chip radio-frequency integrated circuit (RFIC) solution, the present invention proposes an on-chip bandstop filter (for image rejection) and bandpass filter (for band selection) integrated into one unit 15, as illustrated in FIG. 1b. By adding an LC tank into the output matching network of an LNA, an on-chip bandpass filter can be realized. To further improve the filter performance a Q-enhancement circuit can be used for Q-tuning of the bandpass filter. In the following recent articles, on-chip notch filters have been proposed to reject the image signal, which can provide good noise and linearity performance:

Chunbing Guo, A. N. L. Chan, and H. C. Luong, "A Monolithic 2-V 950-MHz Bandpass Amplifier with A Notch Filter for Wireless Receivers," IEEE Radio Frequency Integrated Circuits Symposium, 2001, pp. 79–82.

Yuyu Chang, J. Choma, Jr. and J. Wills, "An Inductorless Active Notch Filter for RF Image Rejection," Proc. IEEE Int. Symp. on Circuits and Systems, 1999, pp. 166–169.

H. Samavati, H. R Rategh, and T. H. Lee, "A 5-GHz CMOS Wireless LAN Receiver Front End," IEEE Journal of Solid State Circuits, vol. 35, no. 5, May 2000, pp. 765–772.

M. H. Koroglu and P. E. Allen, "LC notch filter for image-reject applications using on-chip inductors," Electronics Letters, Mar. 1, 2001, vol. 37, No. 5, pp. 267–268.

J. Macedo, M. Copeland, and P. Schvan, "A 2.5 GHz monolithic silicon reject filter," IEEE 1996 Custom Integrated Circuits Conference, pp. 193–196.

J. W. M. Rogers and C. Plett, "A Completely Integrated 1.8 Volt 5 GHz Tunable Image Reject Notch Filter," IEEE Radio Frequency Integrated Circuits Symposium, 2001, pp. 75–78.

Since usually low Q inductors are used in the design of LC notch filters the adding of a Q-enhancement circuit is necessary because it would improve the equivalent Q value of the filter and achieve a deeper notch response. Although a simple Q-enhancement circuit is cheap to implement, it needs a large DC bias current to achieve a good notch filter response. For this reason, a development of a notch filter with a low complexity Q-enhancement circuit and a small bias current is very valuable in receiver design. The frequency tuning of a notch filter can be implemented by incorporating varactors into the LC series tank circuit of the notch filter. The capacitance of the tank can then be changed by varying the tuning voltage across the varactor. Unfortunately, it is observed that for a specified choice of tuning voltage, only an optimal current value exists to give the deepest notch response. That means for a different tuning voltage to attain the deepest notch at a corresponding frequency, different currents are required. The desired notch filter is the one which can achieve a deep notch during a wide frequency band. To solve this problem, a new invention to change the bias current automatically with the tuning voltage is proposed.

In the literature some integrated image rejection filters or notch filters have been implemented for RF applications:

In Chunbing Guo, A. N. L. Chan, and H. C. Luong, "A monolithic 2-V 950-MHz bandpass amplifier with a notch filter for wireless receivers" as referenced above, a monolithic 2 V 950 MHz notch filter has been integrated with a bandpass LNA in a 0.5 $\mu$m CMOS process. A Q-enhancement circuit has been adopted to compensate the low Q inductor loss. The notch filter can achieve 50 dB image rejection but consumes a DC current of 25 mA.

An inductorless active notch filter working at a central frequency 1.482 GHz is designed in a 0.5 $\mu$m CMOS process in Yuyu Chang, J. Choma, Jr. and J. Wills, "An inductorless active notch filter for RF image rejection", as referenced above. The notch filter utilizes a two Q-enhancement technique to circumvent the low Q characteristics inherent in the designed feedback circuit, which can provide image signal suppression of 70 dB. However, its power consumption of 35 mW is high.

In H. Samavati, H. R Rategh, and T. H. Lee, "A 5-GHz CMOS wireless LAN receiver front end", as referenced above, a 5 GHz notch filter integrated with an LNA and used for a wireless LAN receiver has been implemented in a standard 0.24 $\mu$m CMOS process. 8.4 mA of current is used for both LNA and notch filter at 2 V Vdd. Only 12 dB image rejection is achieved.

An LC notch filter working at 1.1 GHz is implemented in a 0.35 $\mu$m CMOS process in M. H. Koroglu and P. E. Allen, "LC notch filter for image reject applications using on-chip inductors", as referenced above. Transconductor based Q-enhancement circuits are used and image rejection after Q tuning is 70 dB. The current consumption is over 6 mA.

A 2.5 GHz Monolithic bipolar image rejection filter has been implemented in J. Macedo, M. Copeland, and P. Schvan, "A 2.5 GHz monolithic silicon reject filter", as referenced above. Using 0.8 $\mu$m BiCMOS technology, the filter is integrated with a 1.9 GHz LNA and can achieve better than 50 dB image rejection. The DC current consumption is 3.2 mA at 3 V.

A 5 GHz integrated notch filter has been realized in SiGe process with 50 GHz $f_t$ in J. W. M. Rogers and C. Plett, "A completely 1.8 Volt 5 GHz tunable image reject notch filter", as referenced above. It can achieve 70 dB image rejection with a current consumption of 4 mA. The noise figure is 4.2 dB.

In U.S. Pat. No. 6,072,376 (Matsuyoshi et al.), a notch filter is connected to a LNA for eliminating a disturbing signal (e.g. image signal). Both impedance matching and noise figure matching without using an isolator have been achieved and has low-noise characteristics.

In U.S. Pat. No. 6,285,865 (Vorenkamp et al.) and U.S. Patent Application publication 2001/0008430A1 "System And Methods For Providing A Low Power Receiver Design", an integrated receiver with channel selection and image rejection is substantially implemented on a single CMOS integrated circuit. The receiver front end provides a programmable gain low noise amplifier followed by frequency conversion circuits. Frequency conversion circuits use LC filters integrated onto the substrate in conjunction with image reject mixers to provide sufficient image frequency rejection. Filter tuning and inductor Q compensation are performed by two on chip phase locked loops (PLL).

In U.S. Pat. No. 6,351,502 (Zargari), a radio-frequency front-end, comprised of a low noise amplifier (LNA), a first mixer, and an I/Q quadrature mixer is described. The LNA amplifies and has inductive loads. The first mixer is coupled to the LNA and converts the amplified received signal to an intermediate frequency (IF) signal. The first mixer also has inductive loads. The first frequency is chosen such that an image frequency with the carrier and the frequency of the LO signal is outside the bandwidth of the inductive loads of the LNA. The I/Q quadrature mixer further converts the amplified received signal at the IF to I and Q signals.

In U.S. Pat. No. 6,374,094 (Zappala) [15], a new architecture of a combination of signal circulators and RF bandpass filters is presented, which can selectively notch out sub-bands of the two cellular bands in a cellular radio receiver. Thus the sub-bands can be separately directed to a radio capable of receiving either the A or B-band signals.

In U.S. Pat. No. 6,127,962 (Martinson)[16], a downconversion image rejection mixer is invented. It includes two signal path. The one signal path has a bandpass characteristics centered at the input signal frequency interested, and the other signal path has a bandstop characteristics centered at the same frequency. By choosing one or the other path, useful signal can be downconverted but the image signal will be rejected.

In U.S. Pat. No. 5,625,307 (Scheinberg) [17], a low cost monolithic GaAs upconverter chip for CATV receiver is invented. A novel Gilbert type image-rejecting mixer circuit integrated with two matched inductors is used for image rejection. On chip image rejection filter also have been applied in integrated TV tuner.

U.S. Pat. No. 5,737,035 (Rotzoll) and U.S. Pat. No. 6,177,964 (Birleson et al.) describe circuits similar to U.S. Pat. No. 5,625,307 (Scheinberg) above.

SUMMARY OF THE INVENTION

It is an object of at least one embodiment of the present invention to provide a wideband high-Q notch filter which can be fully integrated with low cost analog circuits.

It is another object of the present invention to provide a wideband high-Q notch filter which can be easily integrated into a single chip RF+IF receiver with very good image rejection.

It is yet another object of the present invention to provide a wideband high-Q notch filter which can achieve a high image rejection ratio in the range of 60 dB.

It is still another object of the present invention to provide a wideband high-Q notch filter which only degrades the noise figure slightly (0.5~1 dB).

It is a further object of the present invention to provide a wideband high-Q notch filter which can be used in commercial wireless communication applications such as GSM, DECT, cordless phones, CDMA etc.

It is yet a further object of the present invention to provide a wideband high-Q notch filter which has a good image rejection in a wide tunable range suitable for wideband high rate wireless communication applications.

It is still a further object of the present invention to provide a wideband high-Q notch filter where low Q inductors are integrated into the circuit and high image rejection can be retained.

These and many other objects have been achieved by providing a monolithic wideband tunable high Q image rejection notch filter. The proposed notch filter is essentially a LC series resonator circuit which is integrated with a differential low noise amplifier (LNA). A two stage LNA circuit is employed where the first stage is single ended and the second stage is differential or where both stages are differential. For each stage, the well-known cascode amplifier with inductive degeneration is selected for better rejection of on-chip common-mode interference. Due to the resistance of the inductor, the Q of the on-chip inductor is commonly very low (around Q=4~6). Two Q-enhancement circuits are combined to generate sufficient negative impedance to compensate for the loss in the on-chip low Q inductors. Only a small bias current is required for the notch filter to attain a deep notch response. To improve the image rejection of the notch filter in a wide frequency band, a novel automatic current tuning technique is applied. Furthermore, by modifying the connection and location of the tunable varactor, another wideband tunable notch filter is implemented. All the invented notch filters can be fully integrated in CMOS (or other, e.g., Bipolar, BiCMOS, SiGe etc.) IC technology and applied in all wireless receiver systems including GSM, DECT, WCDMA, CATV, Bluetooth and Wireless LAN etc.

BRIEF DESCRIPTION OF THE DRAWINGS

FIG. 1a is a high level block diagram of the prior art.

FIG. 2b is a circuit diagram of the first LNA of FIG. 2a.

FIG. 2c is a circuit diagram of the second LNA of FIG. 2a.

FIG. 2d is a circuit diagram of the Q-enhancement circuit of FIG. 2a.

FIG. 2e is a circuit diagram of the tunable current source of FIG. 2a.

FIG. 3b is a circuit diagram of the Q-enhancement circuit of FIG. 2a.

FIG. 4 is a graph of the bandpass and wideband notch filter response of the circuit of FIG. 2a.

FIG. 5 is a graph of the bandpass and wideband notch filter response at an RF frequency of 2.45 GHz of the circuit of FIG. 3a.

FIG. 6 is a graph of the bandpass and wideband notch filter response at an RF frequency of 5.25 GHz of the circuit of FIG. 3a.

FIG. 7b is a circuit diagram of the first LNA of FIG. 7a.

FIG. 7c is a circuit diagram of the second LNA of FIG. 7a.

FIG. 7d is a circuit diagram of the Q-enhancement circuit of FIG. 7a.

FIG. 8 is a graph of the bandpass and notch performance of the circuit of FIG. 7a.

FIG. 9 is a graph of the noise figure of the circuit of FIG. 7a.

FIG. 10 is a graph of the differential output phase of the circuit of FIG. 7a.

FIG. 11a is a polar graph of the input matching of the circuit of FIG. 7a.

FIG. 11b is a graph of the output matching of the circuit of FIG. 7a.

DESCRIPTION OF THE PREFERRED EMBODIMENT

First Preferred Embodiment: A Wideband Notch Filter with Automatic Tuning

Figure 1B:
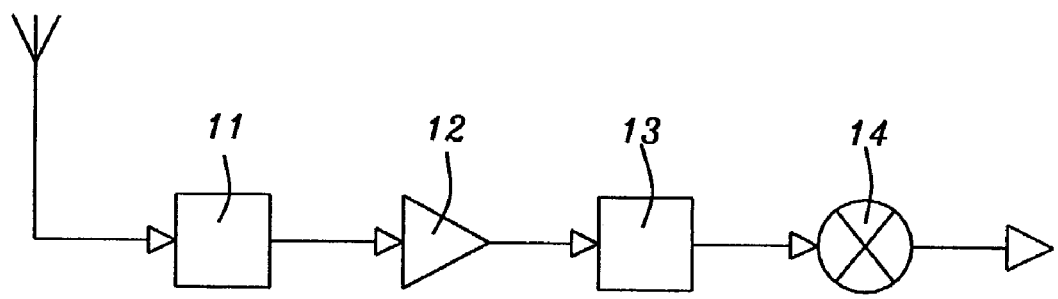
FIG. 1b is a high level block diagram of the present invention.
Figure 1B:
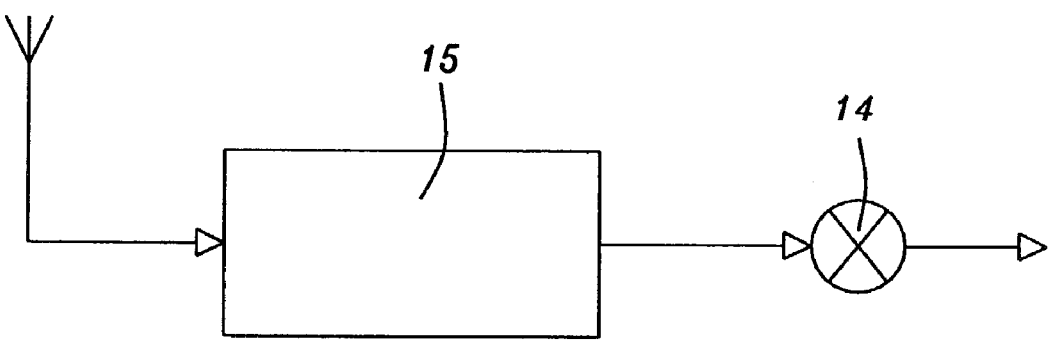
Figure 2A:
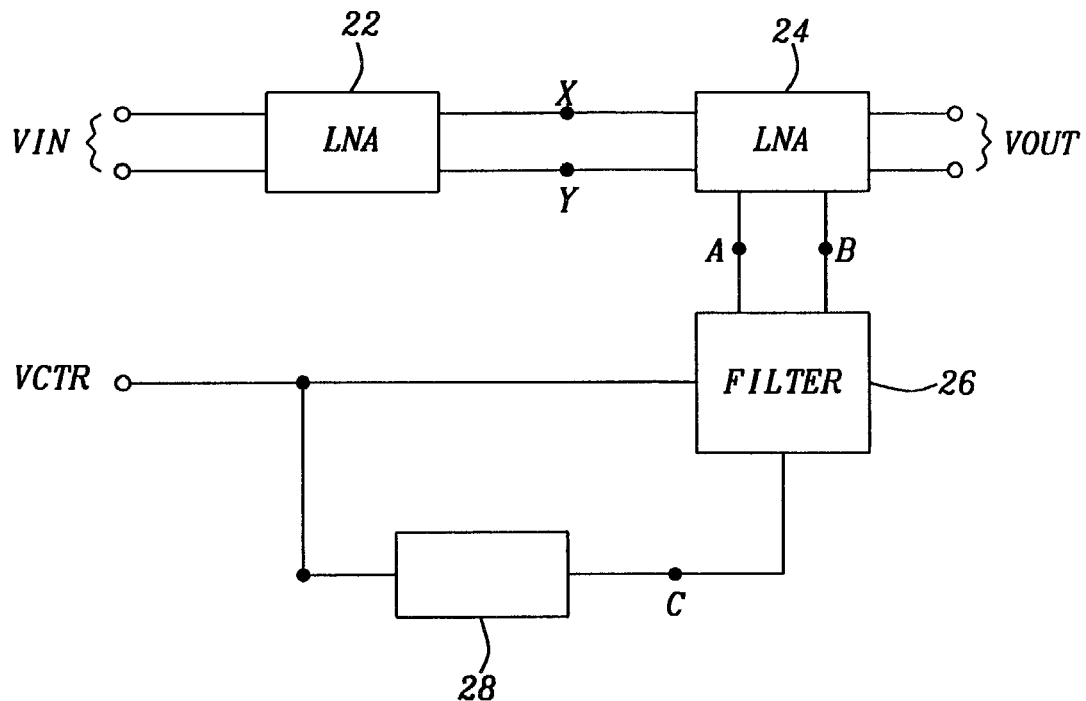
FIG. 2a is a block diagram of a first preferred embodiment of the present invention.

A first preferred embodiment of the inventive notch filter integrated with an LNA is shown in high level block diagram form in FIG. 2a and will be further described in the following text with reference to FIGS. 2b, 2c, 2d and 2e. FIG. 2a shows a first stage LNA 22 with input port VIN, a differential output coupled via terminals X and Y to a similar second stage LNA 24 with output port VOUT (terminal 2 and terminal 3). Coupled to LNA 24 via terminals A and B is notch filter 26. The notch filter is connected both directly, and via tunable current source 28, to input port VCTR.

Figure 2B:
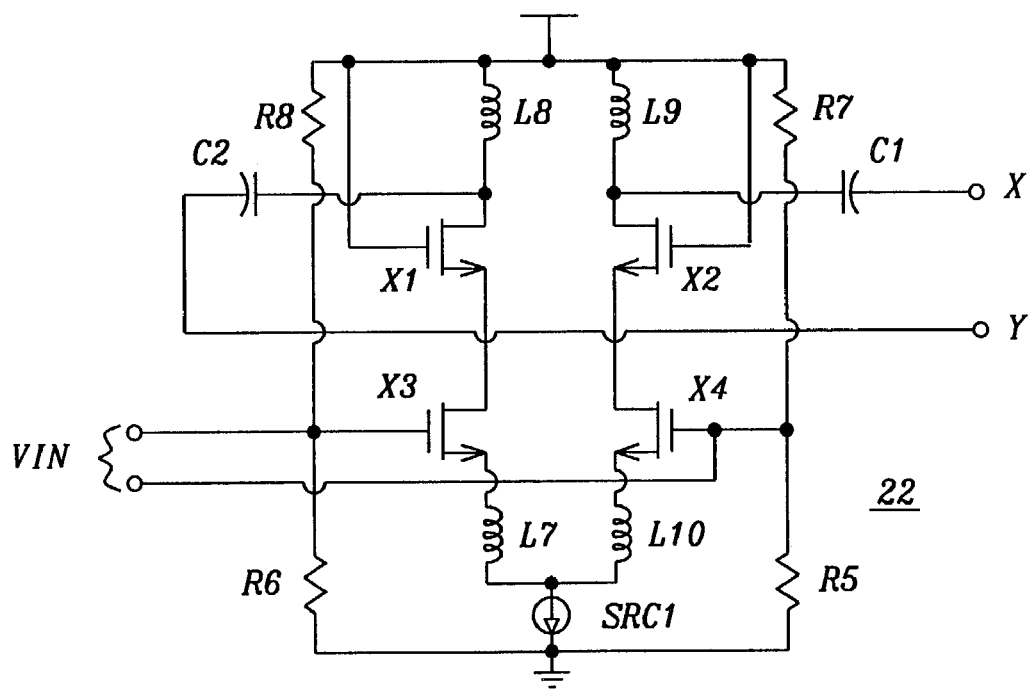
Figure 2C:
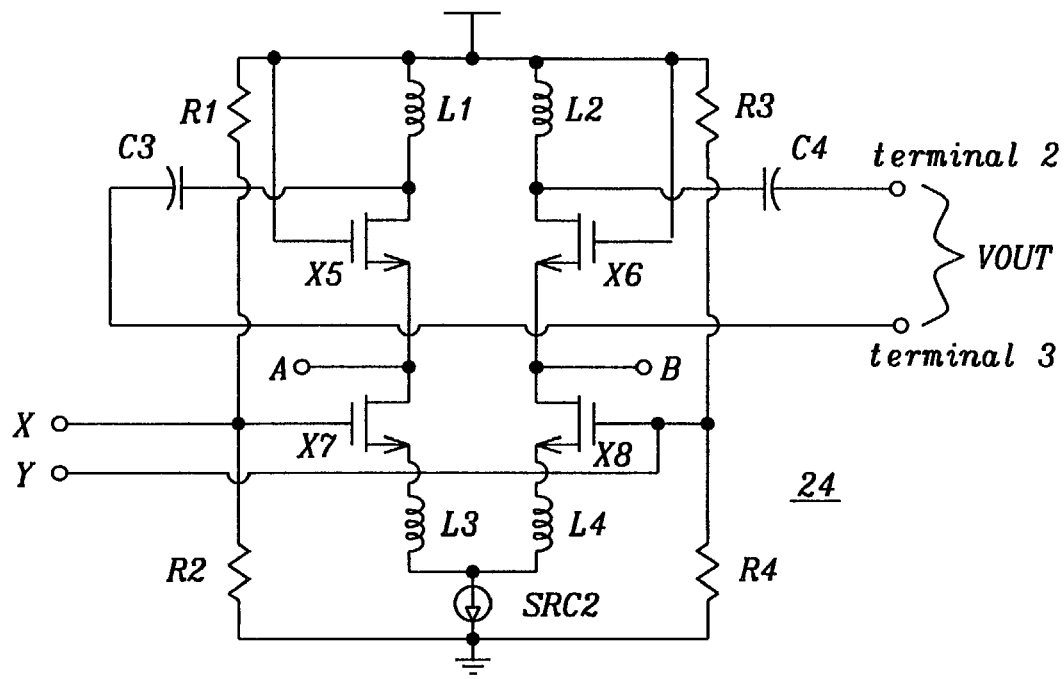

A two stage LNA design is employed to achieve the required gain and noise figure. It has power gain of 20–25 dB and small noise figure (<4 dB). In each stage, the differential LNA design is adopted, so that it can sufficiently reject on-chip common-mode noise. The first-stage LNA 22, as illustrated in FIG. 2b, consists of the cascode transistors X1–X4, with two LC tanks connected at the gate and source degeneration provided by the inductors L7 and L10. LC tank components are selected to resonate at the desired RF frequency. The first stage LNA couples to the second stage LNA 24 via capacitors C1, C2 and terminals X and Y, respectively. The second stage LNA 24, as illustrated in FIG. 2c, has the same structure as the first stage LNA. It includes transistor X5–X8, inductors L1–L4, and capacitors C3–C4. The DC bias voltages are provided by the resistors R5–R8, R1–R4, the bias current is provided by the current source SRC1, SRC2 for the first and second LNA, respectively.

Figure 2D:
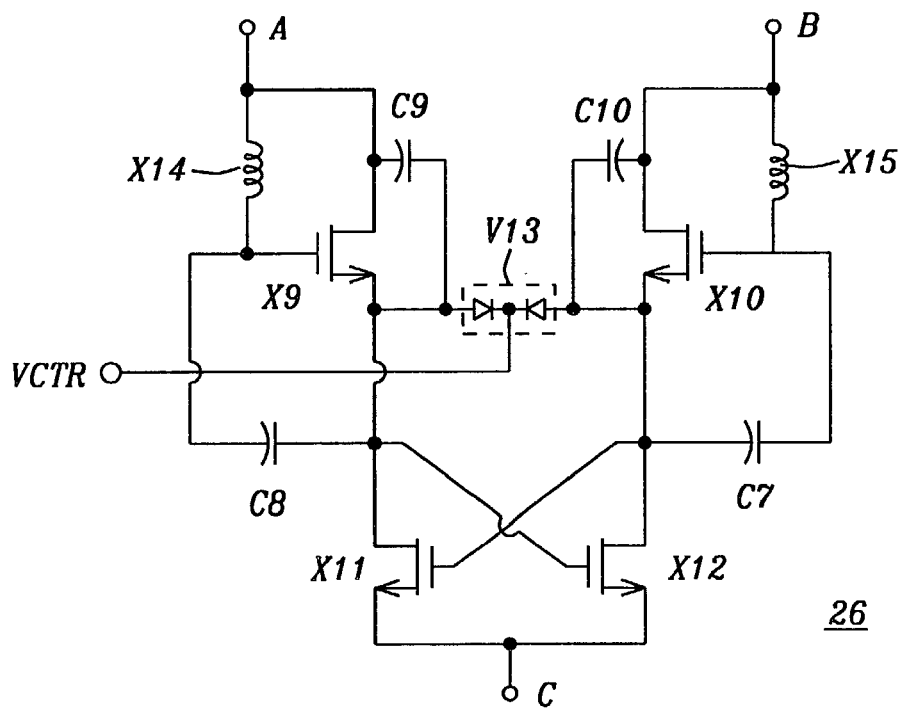

A differential pair is also used in the notch filter 26 of FIG. 2d. The notch filter inputs A and B couple to the drain outputs of transistors X7 and X8. The notch filter consists of transistors X9–X12, two on-chip inductors X14 and X15, capacitors C7–C10 and an on-chip varactor V13 (differential modeling). The series LC resonator (comprising on one side X14, X9, C8, and V13 and on the other side X15, X10, C7, and V13) is resonant at the image frequency (which is two times IF away from the one of the main useful RF signal). Capacitor C9 and C10 are used to adjust the frequency distance between poles and zeros of the complete LNA and notch filter core.

A careful small signal analysis verifies that the series LC resonator of FIG. 2d produces a negative resistance (proportional to the $g_m$ of X9 and X10) which is used to compensate for the loss due to the equivalent resistance of the on-chip inductor (X14 and X15). By careful adjustment of $g_m$ through the bias current, sufficient negative resistance can be generated to cancel the resistance in the inductor, hence increase considerably the effective quality factor Q of the inductor. The cross-connected differential pair X11, X12 is used to generate more negative impedance to further cancel the inductor resistance. Similarly, by tuning the bias current through it, the negative resistance value produced by X11 and X12 can be changed. In this invention, the above two Q-enhancement circuits are connected in series and combined as shown in FIG. 2d. In one variation of FIG. 2a only a common current source is coupled to terminal C to provide the bias current of both Q-enhancement circuits. Analysis and simulation results both verify that the proposed Q-enhancement circuit consumes much less current than either of the above Q-enhancement circuit alone. In addition, the proposed Q-enhancement circuit achieves a very high image rejection.

Figure 2E:
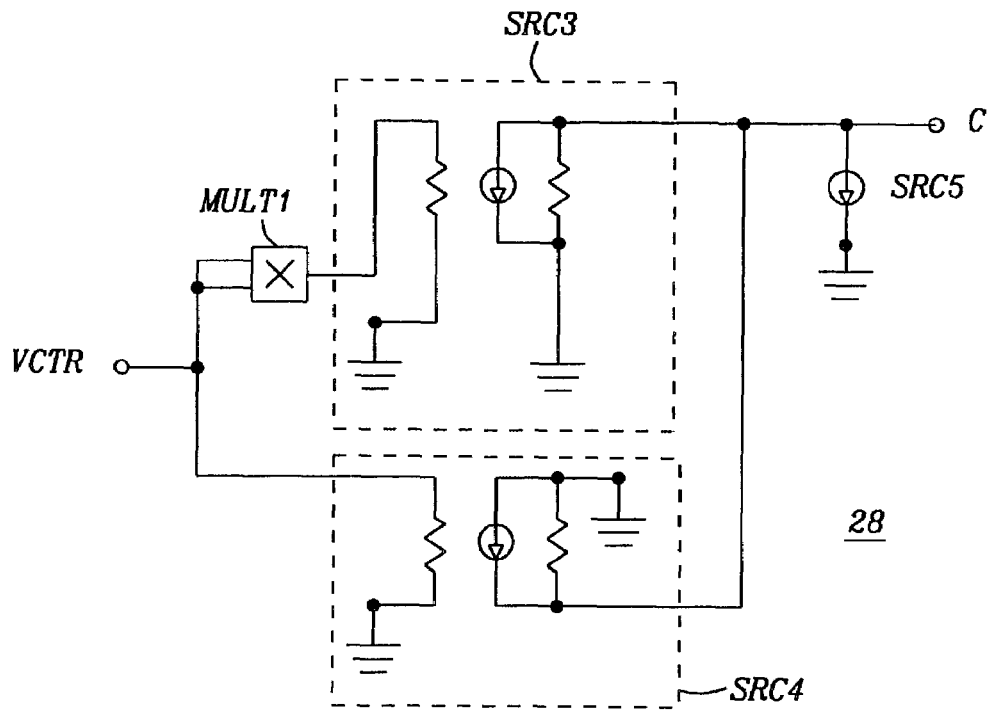

To achieve a deep notch in a wide frequency band, a tunable current source is proposed in another variation of the invention, see FIGS. 2a and 2e. For a rejection of the specified image frequency, the voltage (0–3V) across the varactor needs to be tuned to get the notch response centered at that frequency. It is found that varying this voltage, and thereby the current to the notch filter, affects the rejection level. Only one optimal current level can give the best image rejection (>60 dB); other current levels (larger or smaller than this optimal value) can not provide such a good rejection of the image frequency. The explanation of this phenomenon comes from the fact that changes of the bias current change the value of negative resistance produced by the present Q-enhancement circuits. The optimal current generates a negative resistance, whose absolute value perfectly equals the effective positive resistance of the notch filter. Thus the compensated inductor has a very high effective Q (infinite in theory) and the energy loss due to resistance is perfectly compensated. It has been observed that the optimal bias current $I_{opt}$ is the quadratic function of the tuning voltage ($V_{tune}$), i.e.

$$I_{opt} = \alpha_1 V_{tune}^2 + \alpha_2 V_{tune} + \alpha_3,$$

where the constant coefficients $\alpha_1, \alpha_2, \alpha_3$ can be determined using interpolation methods by collecting and analyzing the simulated, or measured, data $$\{I_{opt}(1), V_{tune}(1), \{I_{opt}(2), V_{tune}(2)\}, \{I_{opt}(3), V_{tune}(3)\},$$

In FIG. 2e, an analog multiplier MULT1, two voltage controlled current sources (VCCS) SRC3 and SRC4, and a fixed current source SRC5 are used to simulate the above function. Since all three coefficients $\alpha_1, \alpha_2, \alpha_3$ are small, the function can be physically realized by analog IC design. Still referring to FIG. 2e, the analog multiplier MULT1 and SRC3 are coupled between input port VCTR and terminal C. SRC4 is coupled between VCTR and terminal C. Also coupled to terminal C is SRC5. The current in SRC4 flows in opposite direction to the current in SRC3 and SRC5.

Figure 3A:
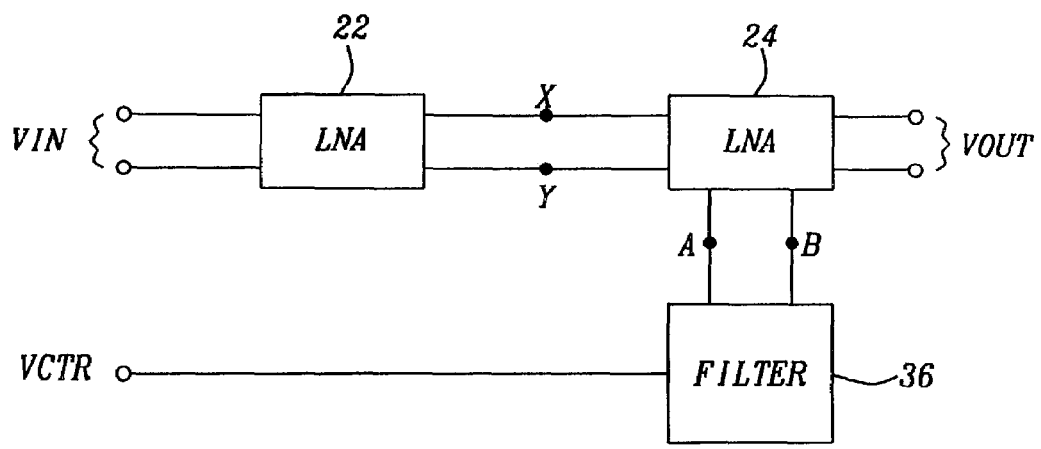
FIG. 3a is a block diagram of a second preferred embodiment of the present invention.
Figure 3B:
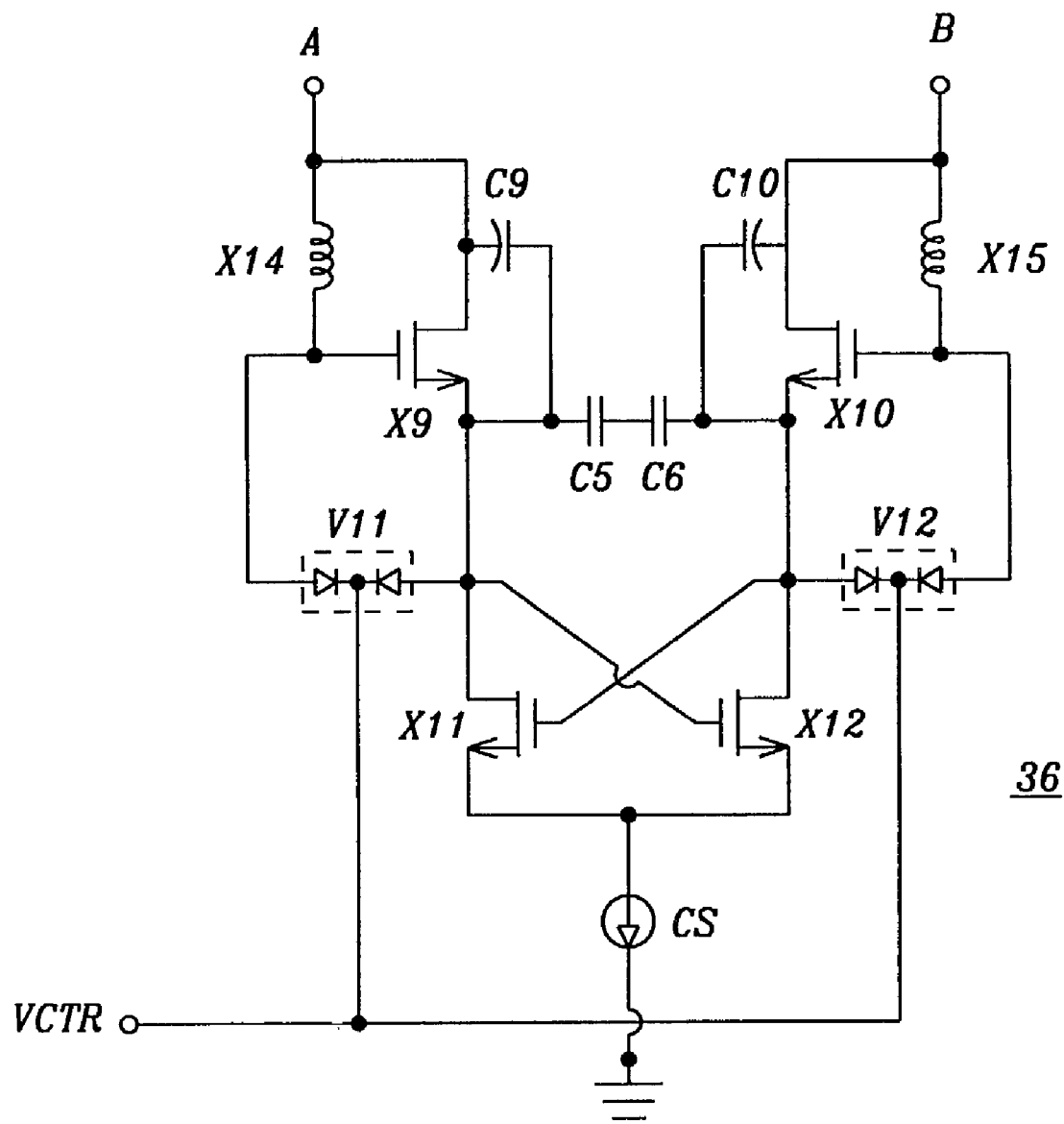
Figure 4:
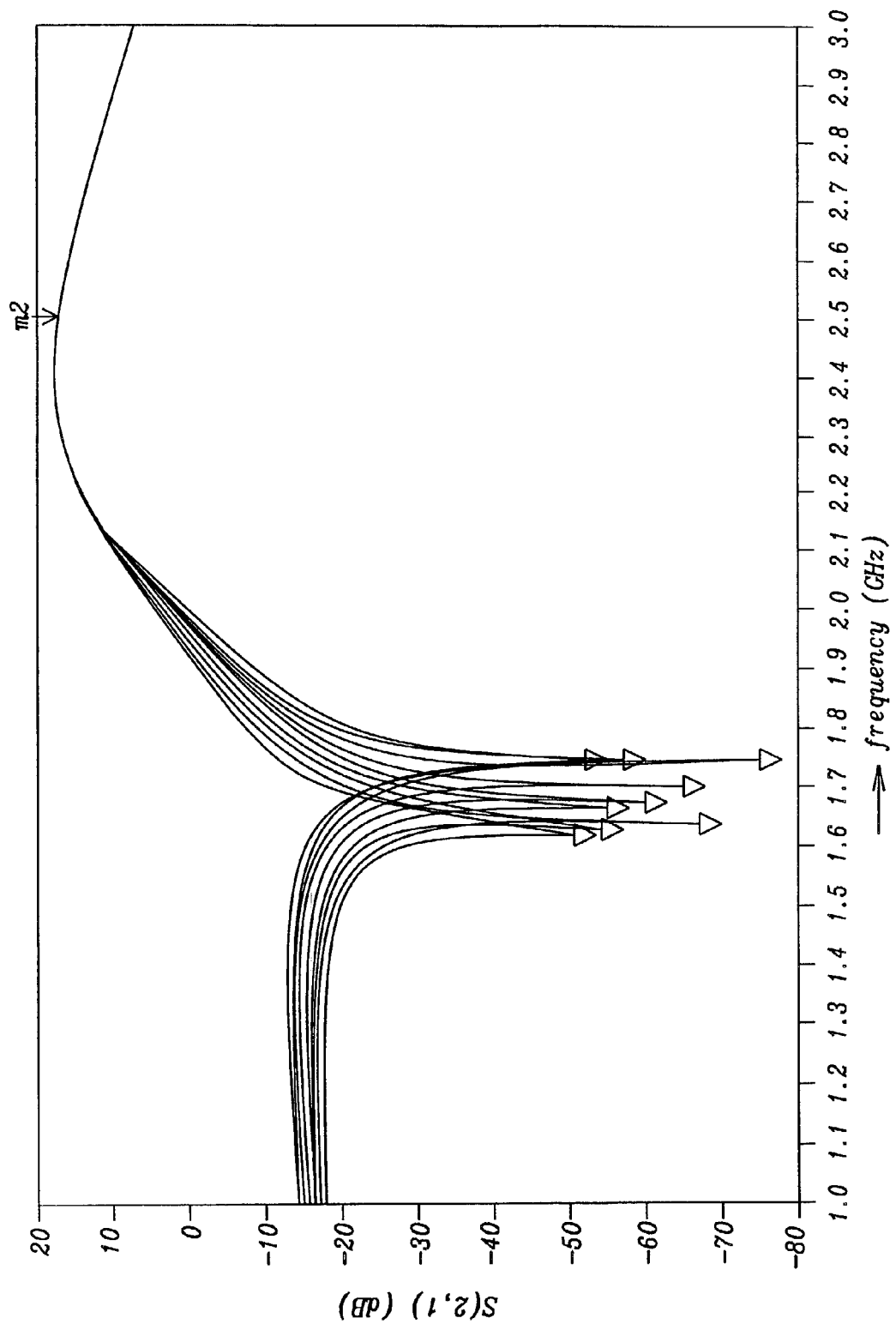

FIG. 4 illustrates a group of curves depicting the performance of the first preferred embodiment of a wideband notch filter, in dB vs. frequency, implemented with automatic current tuning for Bluetooth applications with the following circuit simulation results (the arrow indicates the notch and point m2 the peak of the bandpass):
RF frequency: 2.40–2.50 GHz,
Image frequency: 1.64–1.74 GHz
IF frequency: 380 MHz
Current source coefficients: $\alpha_1$=0.75 mS, $\alpha_2$=3.871 mS, $\alpha_3$=12.868 mA
On-chip inductor Q value: 3.4
Image rejection: 54–67 dB, on average
Bandpass gain: 20 dB
Tuning range: 100 MHz Second Preferred Embodiment: A Wideband Notch Filter with Two Varactors In a second preferred embodiment of the inventive notch filter, a wideband notch filter is implemented using two varactors. FIG. 3a is a high level block diagram and FIG. 3b is the circuit diagram of this second preferred embodiment. The first and second stage LNAs of FIG. 3a are identical to the LNAs 22 and 24 of FIG. 2a. The wideband notch filter 36, coupled to LNA 24 via terminals A and B, is illustrated in more detail in FIG. 3b and will be described next.

The two fixed capacitors C7 and C8 of FIG. 2d (and shunted across the gate and the source of transistor X9 and X10) are now replaced in FIG. 3b by two varactors V12 and V11, respectively. The third terminal of varactors V11 and V12 is coupled to input port VCTR. Between the source of transistors X9 and X10, two fixed capacitors C5 and C6 have been used instead of the varactor in FIG. 2d. The current tuning circuits have also been removed. The swapping of the location of varactors and capacitors dramatically extends the notch frequency band, where the notch filter can attain nearly the deepest notch without the need of current tuning.

All other components are as shown in FIG. 2d. A common current source CS is coupled to the source of transistors X11 and X12.

Figure 5:
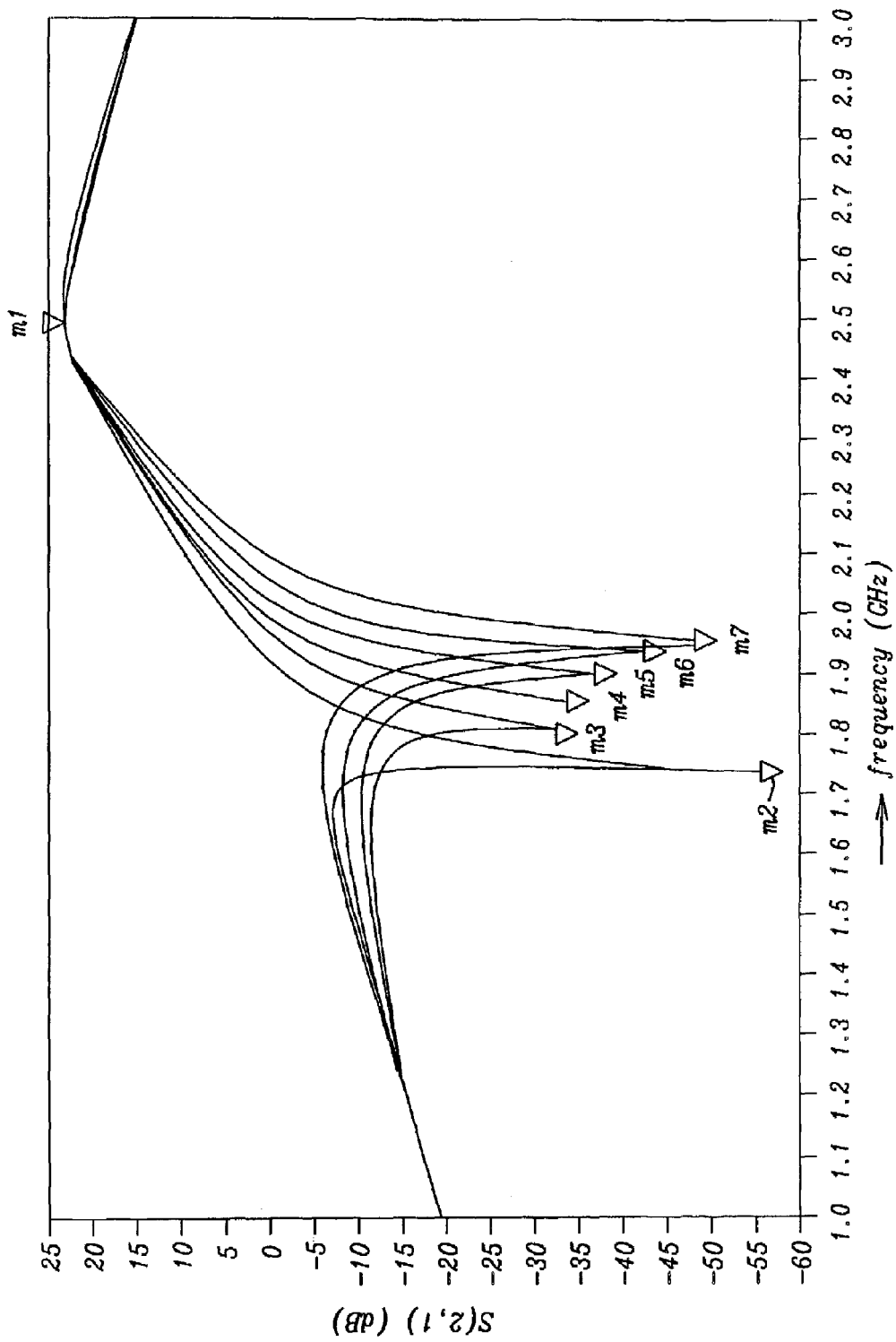

FIG. 5 illustrates a group of seven curves depicting the performance of the second preferred embodiment of a wideband notch filter, in dB vs. frequency, implemented using two varactors for Bluetooth applications with the following circuit simulation results (where point m1 indicates the peak of the bandpass and points m2 to m7 define the notch):
RF frequency: 2.40–2.50 GHz,
Image frequency: 1.80–1.90 GHz
IF frequency: 300 MHz
On-chip inductor Q value: 3.4
Image rejection: 36–59 dB, on average
Bandpass gain: ~20 dB
Tuning range: 200 MHz (1.76–1.96 MHz)

Figure 6:
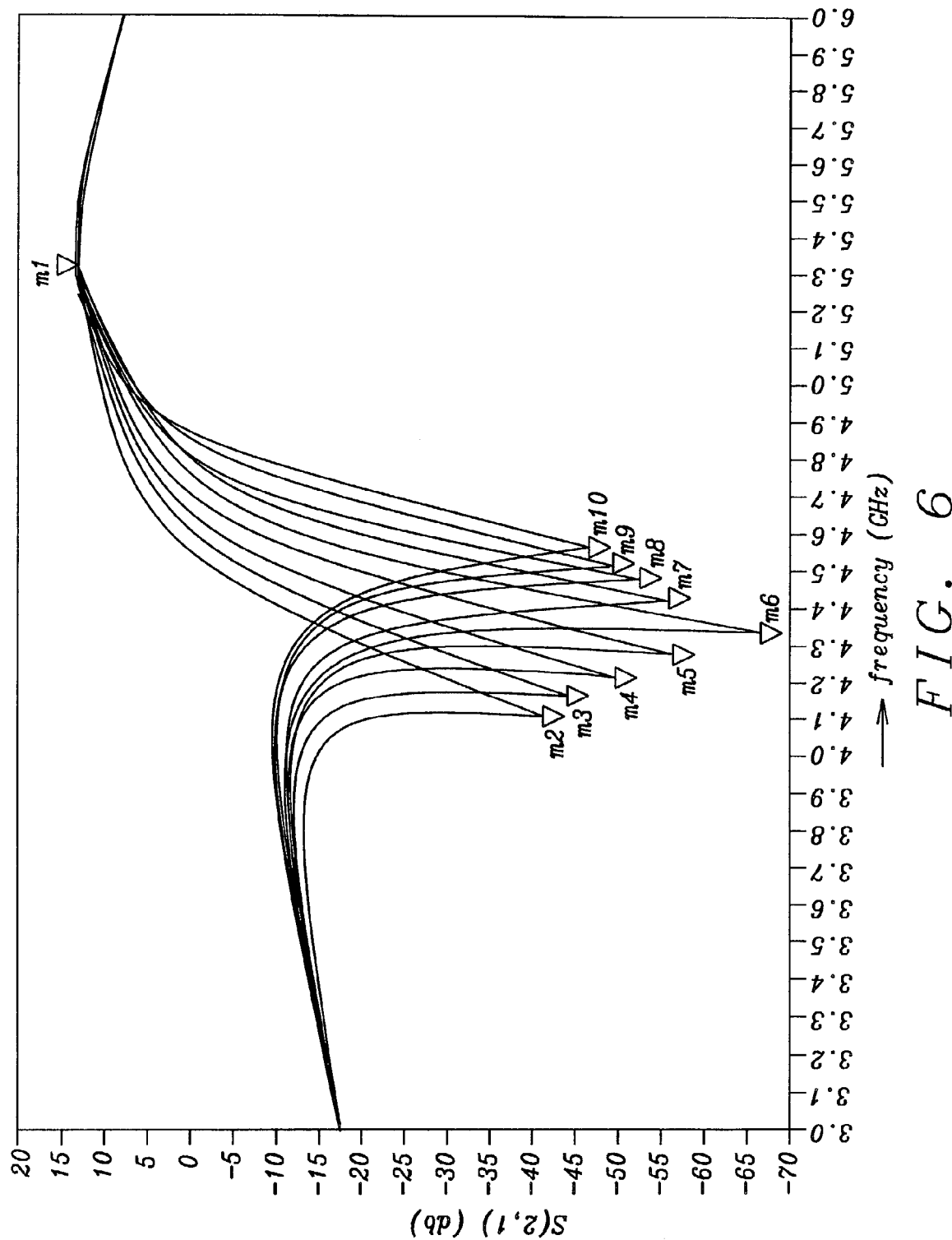

FIG. 6 illustrates a group of ten curves depicting the performance of the second preferred embodiment of a wideband notch filter, in dB vs. frequency, implemented using two varactors for Wireless LAN (802.11a) applications with the following circuit simulation results (where point m1 indicates the peak of the bandpass and points m2 to m10 define the notch):
RF frequency: 5.15~5.35 GHz,
Image frequency: 4.2~4.4 GHz
IF frequency: 475 MHz
On-chip inductor Q value: 6
Image rejection: 41–56 dB, on average
Bandpass Gain: ~20 dB
Tuning range: 350 MHz (4.10~4.45 MHz)

Figure 7A:
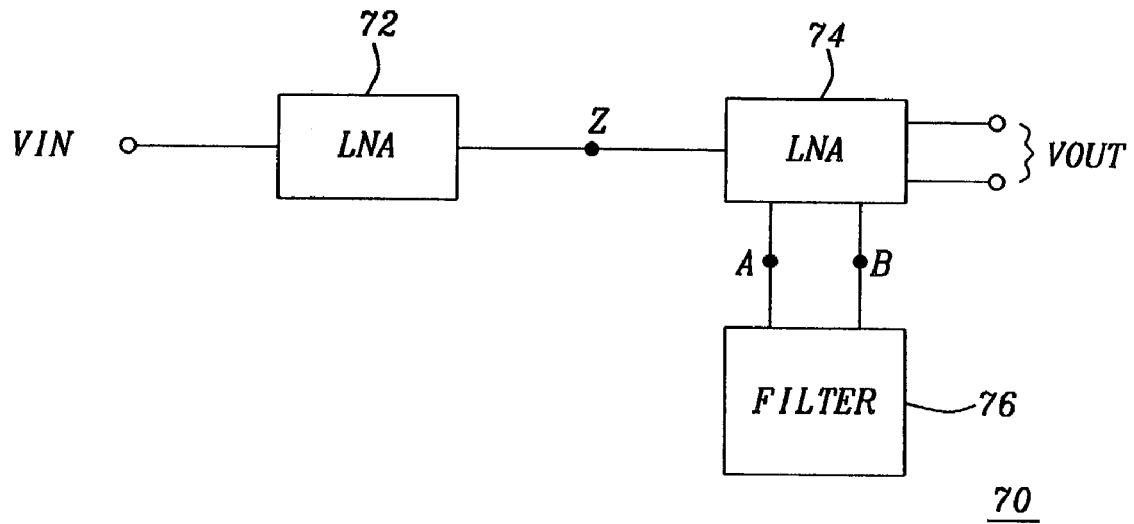
FIG. 7a is a block diagram of a third preferred embodiment of the present invention.
Figure 7B:
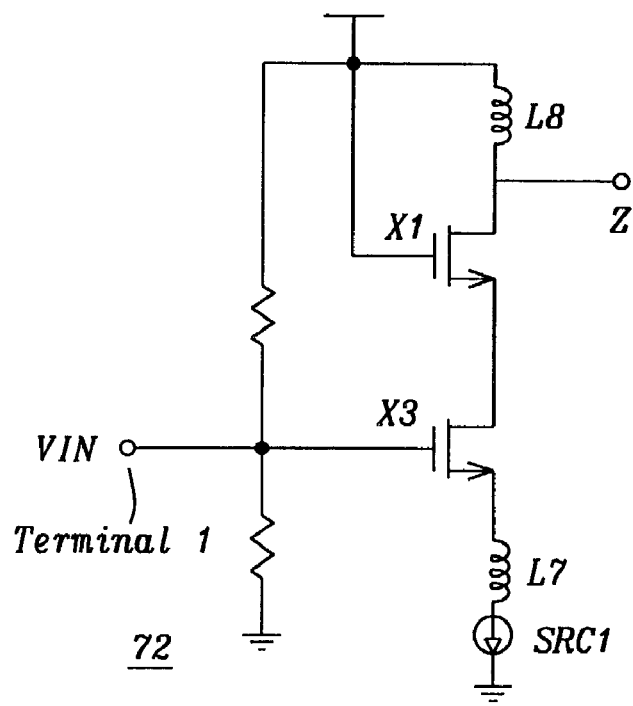

Third Preferred Embodiment: A Wideband Notch Filter Integrated with a Two Stage LNA A third preferred embodiment of the inventive notch filter, integrated with a single ended first stage LNA and a differential second stage, is shown in high level block diagram form in FIG. 7a and will be described in the following text with reference to FIGS. 7b, 7c, and 7d. FIG. 7a shows a first stage LNA 72 with input port VIN (terminal 1), a single ended output coupled via terminal Z to a differential second stage LNA 74 with output port VOUT (terminal 2 and terminal 3). Coupled to LNA 74 via terminals A and B is notch filter 76. The first-stage LNA 72 is illustrated in FIG. 7b. It consists of the cascode transistors X1 and X3, where the gate of X3 is coupled to input VIN (terminal 1) and its source to inductor L7. The gate of X1 and its drain, via inductor L8, are coupled to a power supply. The drain of X1 is coupled to terminal Z, which is the output of the first LNA stage.

Figure 7C:
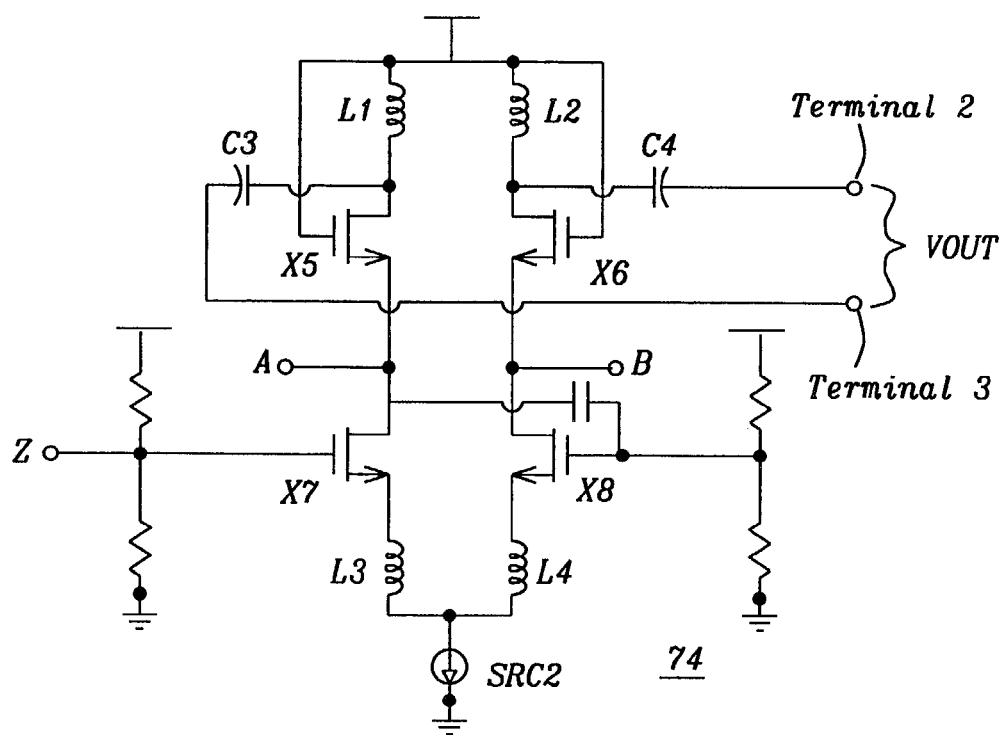

The second stage LNA 74 is illustrated in FIG. 7c. It is similar to the second stage LNA of FIG. 2c so that only the differences will be described. Note that the input (terminal Z) is coupled to the gate of X7 and that the drain of transistor X7 is coupled to the gate of X8 via capacitive means. This connection converts the single ended signal coming from the first LNA stage 72 (terminal Z) into a differential signal used for the second stage LNA 74.

Figure 7D:
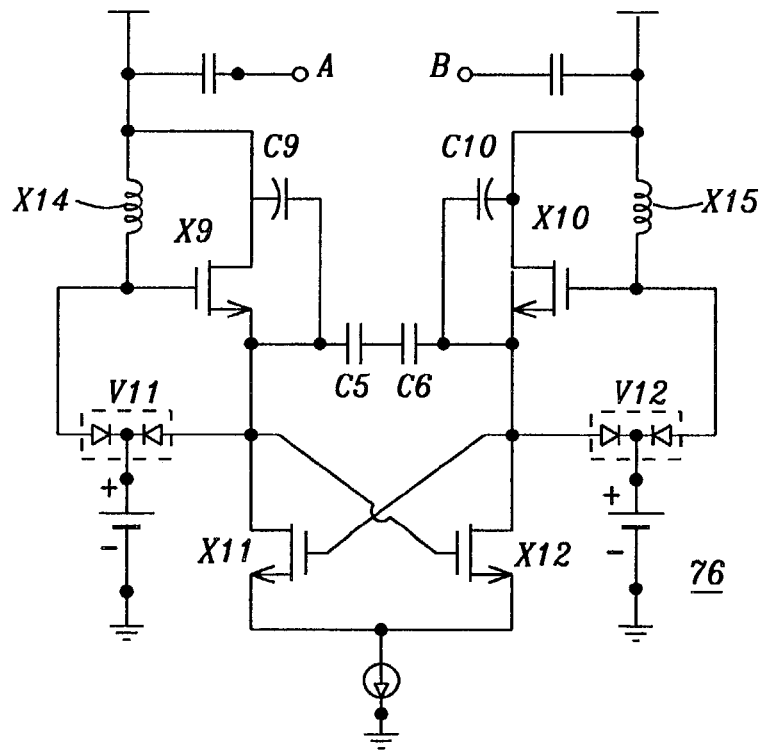

Referring now to FIG. 7d, the wideband notch filter of the third preferred embodiment of the invention is implemented using two varactors similar to the notch filter of FIG. 3b, so that only the differences will be described. Note that the third terminal of varactors V11 and V12 is coupled via a voltage supply to a reference potential (typically ground). Also the junction of X14 and C9 is coupled via capacitive means to terminal A, and the junction of Xl5 and C10 is coupled via capacitive means to terminal B.

Results

FIGS. 8 to 11 illustrate various results of circuit simulation of the performance of the third preferred embodiment of a wideband notch filter implemented using 0.35 μm CMOS processes and modeling, a two stage LNA, where the first stage is single ended and the second stage is differential, with a notch filter using two varactors and no current tuning for Bluetooth.

Figure 8:
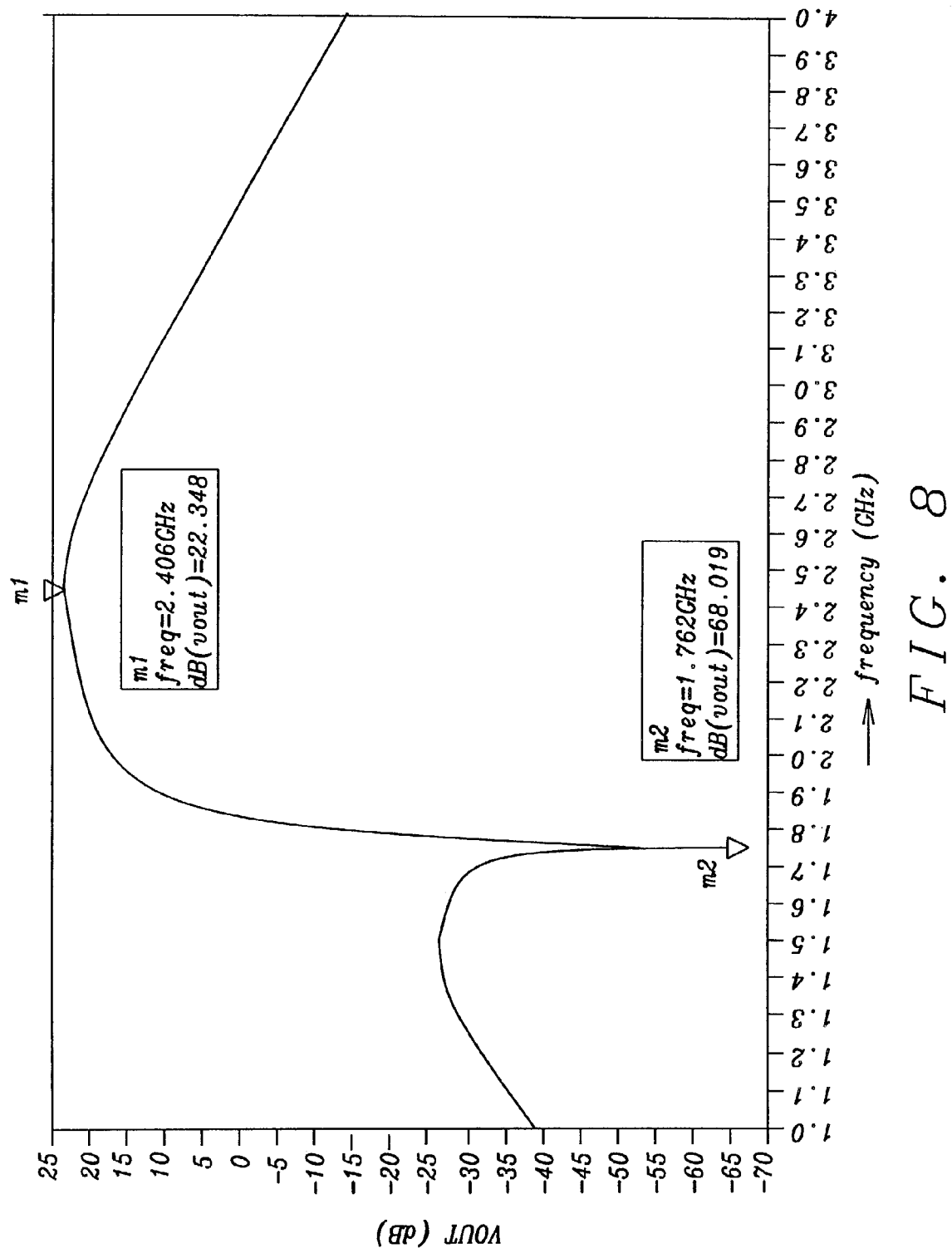

FIG. 8 illustrates the bandpass and notch performance, in dB vs. frequency, of VOUT (differential outputs between terminals 2 and 3, equal to S(3,1)–S(2,1)) where point m1 indicates the bandpass gain and point m2 indicates the notch attenuation as listed below:

RF frequency: 2.40–2.50 GHz,
Image frequency: 1.70–1.80 GHz
IF frequency: 350 MHz
On-chip inductor Q value: 3.4
Image rejection: ~65 dB
Bandpass Gain: ~22 dB
Tuning range: 200 MHz (1.70–1.90 MHz)
Noise Figure: ~4 dB Where S(2,1) is the forward transmission gain from terminal 1 to terminal 2, and S(3,1) is the forward transmission gain from terminal 1 to terminal 3.

Figure 9:
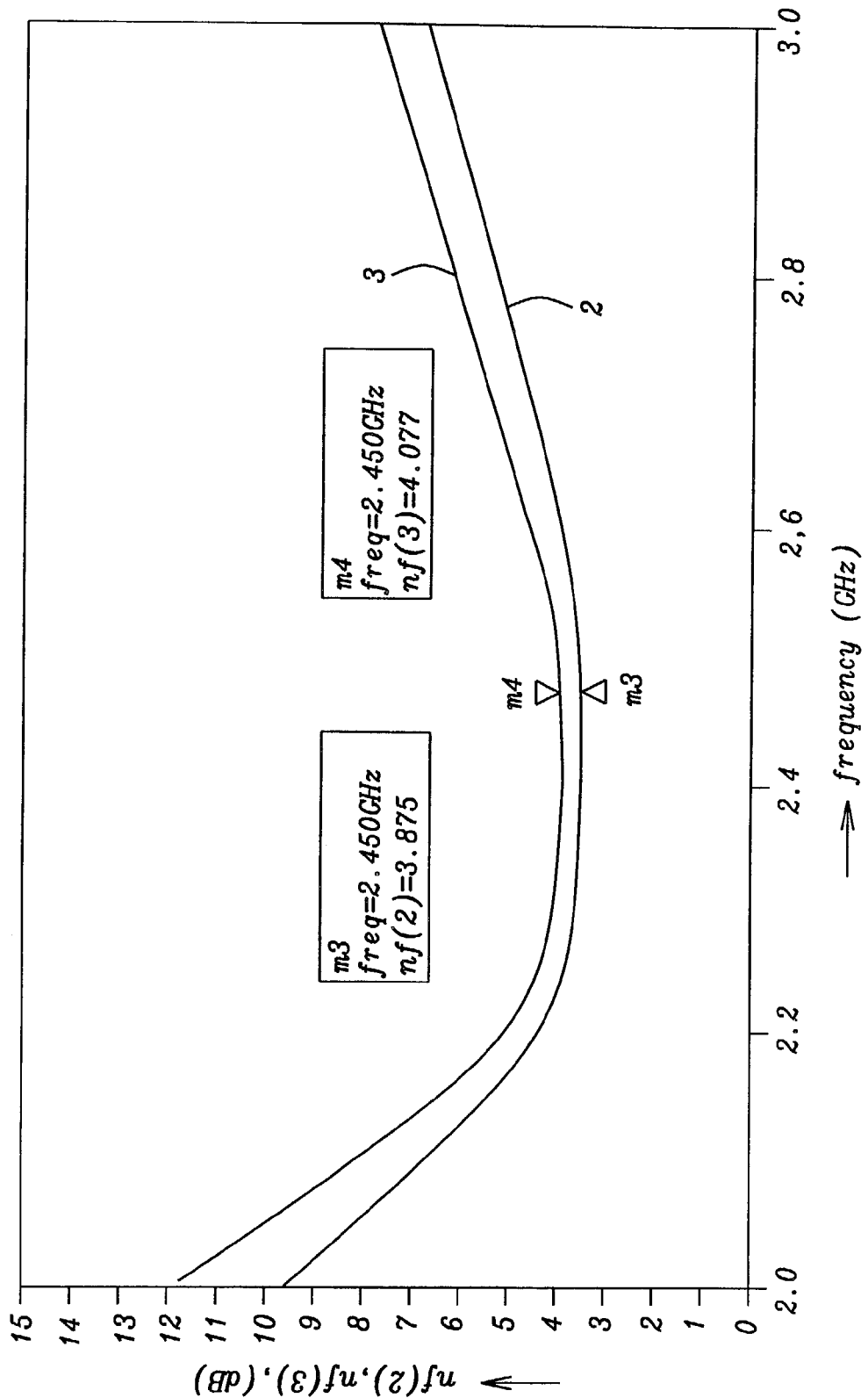

FIG. 9 illustrates the noise figure in dB vs. frequency, where Curve 2 and Curve 3 represent the noise figure for nf(2) and nf(3), respectively. Points m3 and m4 indicate the lowest noise figure for nf(2) and nf(3), respectively.

Where nf(2) is the noise figure at output terminal 2 with reference to terminal 1, and nf(3) is the noise figure at output terminal 3 with reference to terminal 1.

Figure 10:
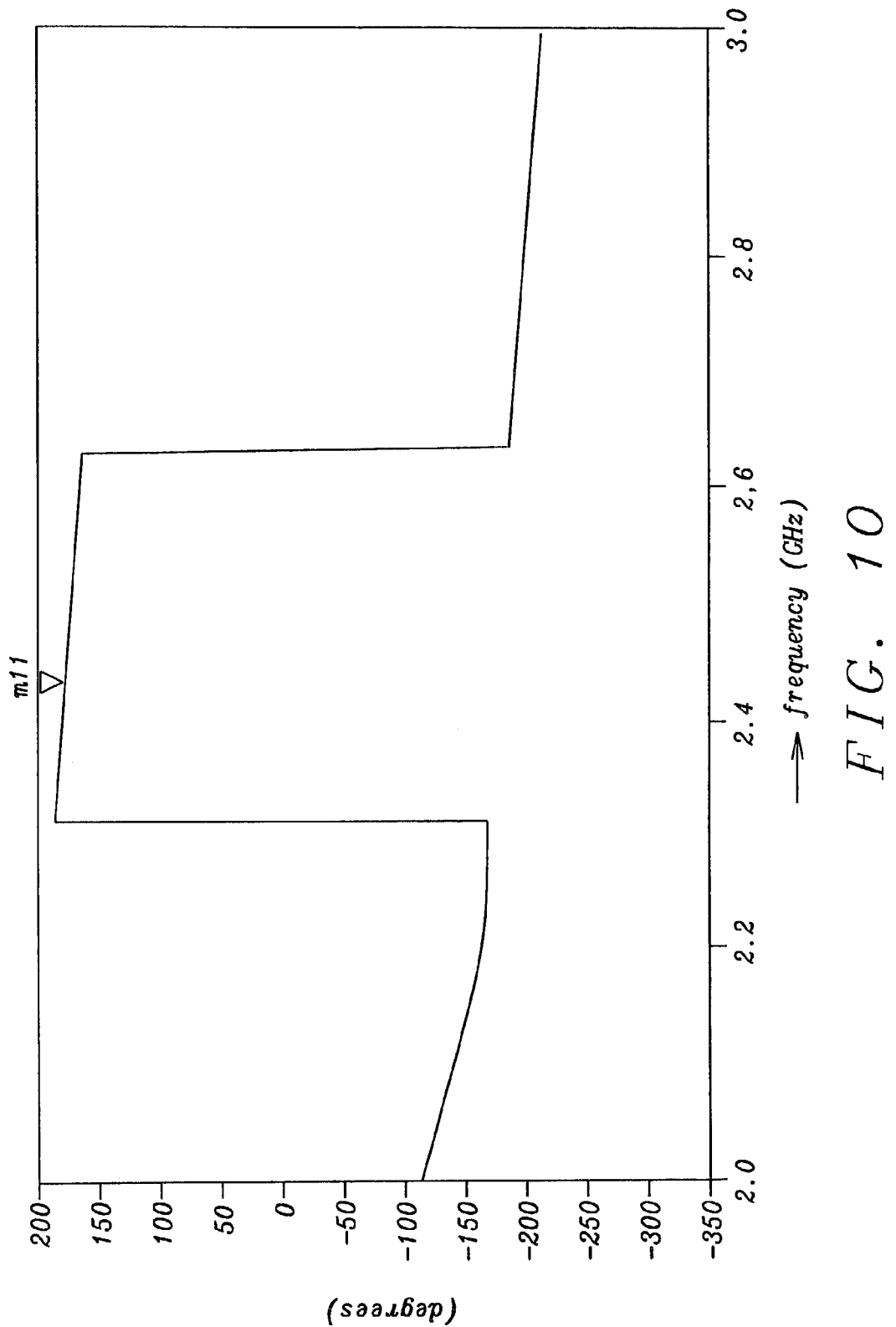

The curve of FIG. 10 illustrates the differential output phase in degrees vs. frequency, indicating at point m11 a phase difference of 172.7 degrees at a frequency of 2.45 GHz.

Figure 11A:
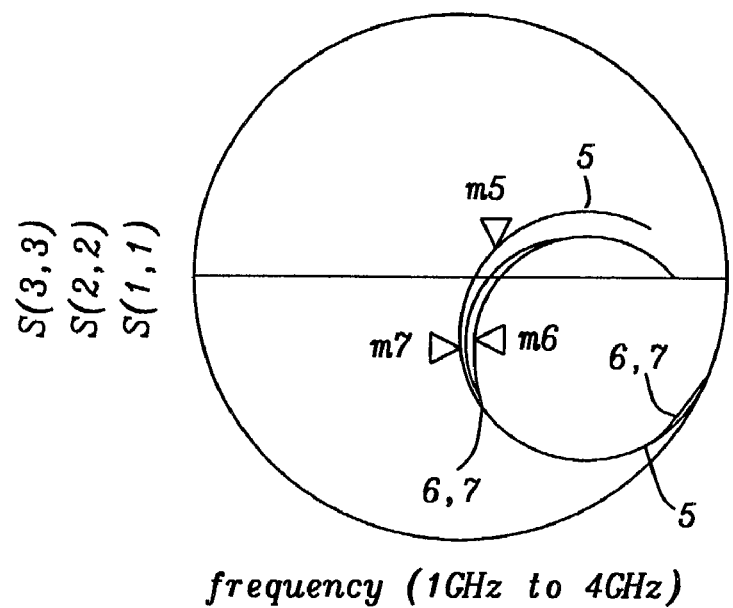
Figure 11B:
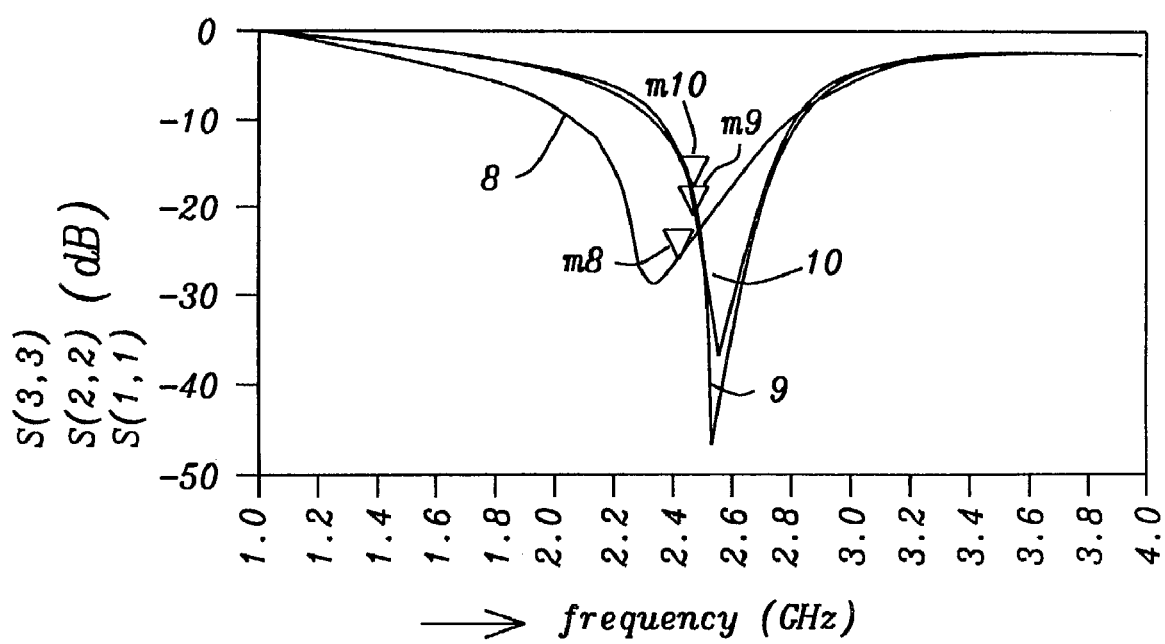

FIGS. 11a and 11b provide the input and output matching graphs in terms of impedance and dB vs. frequency, respectively, at 2.45 GHz.

FIG. 11a:

Point m5 for S(1,1) is on Curve 5, impedance=$Z_0$*(0.952+j0.167).

Point m6 for S(2,2) is on Curve 6, impedance=$Z_0$*(0.884–j0.265).

Point m7 for S(3,3) is on Curve 7, impedance=$Z_0$*(0.823–j0.301).

Note that Curves 6 and 7 overlap almost completely.

FIG. 11b:

Point m8 for S(1,1) is on Curve 8, attenuation=–21.016 dB.
Point m9 for S(2,2) is on Curve 9, attenuation=–16.358 dB.
Point m10 for S(3,3) is on Curve 10, attenuation=–14.467 dB.

Where S(1,1), is the input reflection coefficient for terminal 1,

S(2,2) is the output reflection coefficient for terminal 2, and

S(3,3) is the output reflection coefficient for terminal 3.

Note that Curves 9 and 10 overlap to a large extend.

Advantages

1). The new invention can be fully integrated with low cost analog circuits. It can be easily integrated into a single chip RF+IF receiver with very good image rejection, hence the invented core can be widely used in all kinds of low cost, low power, and high performance transceiver chipsets such as CMOS Bluetooth, wireless LAN transceiver chipset.

2). The new invention can achieve a high image rejection ratio (over 60 dB theoretically) by only adding a few extra circuit components together with an LNA. It only degrades the noise figure slightly (0.5~1 dB) compared to the LNA alone. This attractive feature enables it to be used in most of the commercial wireless communication applications such as GSM, DECT, cordless phones, CDMA, and so on.

3). The new invention has a good image rejection in a wide tunable range, which is suitable for wideband high rate wireless communication applications such as 802.11a, 802.11 g, WCDMA etc.

4). Low Q inductors can be integrated in the new invention and high image rejection can be retained.

5). Low current consumption of the new invention is realized by using a novel Q-enhancement circuit. The higher Q of inductor is integrated, and the notch filter has a lower current consumption.

While the invention has been particularly shown and described with reference to the preferred embodiments thereof, it will be understood by those skilled in the art that various changes in form and details may be made without departing from the spirit and scope of the invention.

What is claimed is:

1. A wideband tunable high Q image rejection notch filter comprising:

a Q-enhancement circuit used in a notch filter by creating a negative resistance to compensate for resistive losses in inductive components of said Q-enhancement circuit, said Q-enhancement circuit comprising:

a differential series LC resonator comprising a first and a second transistor, where the source and the drain of said first and said second transistor are paralleled by a first and a second capacitive means, respectively, where a first and a second inductive means is coupled across the gate and the drain of said first and said second transistor, respectively, where the drains of said first and said second transistor are the input terminals of said Q-enhancement circuit, where the sources of said first and said second transistor are coupled together via a first and a second terminal of a capacitance tunable varactor means, where a third terminal of said capacitance tunable varactor means is coupled to an input port providing an input signal, and where the drain of said first and said second transistor is coupled via capacitive means to the gate of said first and said second transistor, respectively, where said differential series LC resonator is a transconductor based negative resistance generator resonating at an image frequency to compensate for the resistance of said inductive means; and a differential Q compensation circuit providing extra negative impedance to further compensate for the resistance of said inductive means of said differential series LC resonator, said differential Q compensation circuit comprising a cross-coupled differential third and fourth transistor, the drain of said third and fourth transistor coupled to the source of said first and said second transistor, respectively.

2. The notch filter of claim 1, wherein a current source is coupled between a reference voltage and the source of said third and said fourth transistor, said current source providing a bias current for said Q-enhancement circuit.

3. The notch filter of claim 1, wherein a tunable current source is coupled between said input port and the source of said third and said fourth transistor, said tunable current source comprising an analog multiplier, two voltage controlled current sources and a fixed current source, said tunable current source improving the image rejection of said notch filter in a wide frequency band by providing for said Q-enhancement circuit a bias current which is the quadratic function of the tuning voltage across said tunable varactor means.

4. The notch filter of claim 1, wherein said inductive means of said LC resonator is an on-chip low Q inductor.

5. The notch filter of claim 1, wherein said capacitive means of said LC resonator are used to adjust the frequency distance between poles and zeros of said notch filter.

6. The notch filter of claim 1, wherein adjustment of the transconductance $g_m$ of said first and said second transistor of said LC resonator increases the quality factor Q of said inductive means of said LC resonator.

7. The notch filter of claim 1, wherein changes of said bias current change the value of the negative resistance of said Q-enhancement circuit.

8. The notch filter of claim 1, wherein said Q-enhancement circuit operates in the range from 2 to 5 GHz (GHz=$10^9$ Hz).

9. The notch filter of claim 1, wherein said Q-enhancement circuit has an image rejection ranging from 55 to 65 dB.

10. The notch filter of claim 1, wherein said Q-enhancement circuit has an image frequency tuning range of 100 MHz (MHz=$10^6$ Hz).

11. A wideband tunable high Q image rejection notch filter comprising:
    a Q-enhancement circuit used in a notch filter by creating a negative resistance to compensate for resistive losses in inductive components of said Q-enhancement circuit, said Q-enhancement circuit comprising:
        a differential series LC resonator comprising a first and a second transistor, where the source and the drain of said first and said second transistor are paralleled by a first and a second capacitive means, respectively, where a first and a second inductive means is coupled across the gate and the drain of said first and said second transistor, respectively, where the drains of said first and said second transistor are the input terminals of said Q-enhancement circuit, where the sources of said first and said second transistor are coupled together via capacitance means, where the source and gate of said first transistor is coupled via first and second terminals of a first capacitance tunable varactor means, where the source and gate of said second transistor is coupled via first and second terminals of a second capacitance tunable varactor means, and where a third terminal of said first and said second capacitance tunable varactor means is coupled to an input port providing an input signal, said varactors extending the notch frequency band of said Q-enhancement circuit, and where said differential series LC resonator is a transconductor based negative resistance generator resonating at the image frequency to compensate for the resistance of said inductive means;
        a differential Q compensation circuit providing extra negative impedance to further compensate for the resistance of said inductive means of said differential series LC resonator, said differential Q compensation circuit comprising a cross-coupled differential third and fourth transistor, the drain of said third and fourth transistor coupled to the source of said first and said second transistor, respectively, and
        a current source coupled between a reference voltage and the source of said third and said fourth transistor, said current source providing a bias current for said Q-enhancement circuit.

12. The notch filter of claim 11, wherein said inductive means of said LC resonator is an on-chip low Q inductor.

13. The notch filter of claim 11, wherein said first and said second capacitive means of said LC resonator are used to adjust the frequency distance between poles and zeros of said notch filter.

14. The notch filter of claim 11, wherein adjustment of the transconductance $g_m$ of said first and said second transistor of said LC resonator increases the quality factor Q of said inductive means of said LC resonator.

15. The notch filter of claim 11, wherein changes in said bias current change the value of the negative resistance of said Q-enhancement circuit.

16. The notch filter of claim 11, wherein said Q-enhancement circuit operates in the range from 2 to 5 GHz (GHz=$10^9$ Hz).

17. The notch filter of claim 11, wherein said Q-enhancement circuit has an image rejection ranging from 35 to 50 dB.

18. The notch filter of claim 11, wherein said Q-enhancement circuit has an image frequency tuning range of 200 MHz (MHz=$10^6$ Hz).

19. The notch filter of claim 11, wherein said Q-enhancement circuit has an image frequency tuning range of 350 MHz (MHz=$10^6$ Hz).

20. A wideband tunable high Q image rejection notch filter comprising:
    a first cascoded LNA having an input and an output, said first cascoded LNA receiving an RF input signal at said input and providing at its output an amplified signal of said RF input signal;
    a second cascoded LNA having an input and an output, said second cascoded LNA input coupled to said output of said first LNA, said second LNA rejecting on-chip common-mode noise;
    a Q-enhancement circuit coupled to said second cascoded LNA, said Q-enhancement circuit used in a notch filter by creating a negative resistance to compensate for resistive losses in inductive components of said Q-enhancement circuit, said Q-enhancement circuit comprising:
        a differential series LC resonator comprising a first and a second transistor, where the source and the drain of said first and said second transistor are paralleled by a first and a second capacitive means, respectively, where a first and a second inductive means is coupled across the gate and the drain of said first and said second transistor, respectively, where the drains of said first and said second transistor are coupled to said second cascoded LNA, where the sources of said first and said second transistor are coupled together via a first and a second terminal of a capacitance tunable varactor means, where a third terminal of said capacitance tunable varactor means is coupled to a third port providing an input signal, and where the drain of said first and said second transistor is coupled via capacitive means to the gate of said first and said second transistor, respectively, where said differential series LC resonator is a transconductor based negative resistance generator resonating at the image frequency to compensate for the resistance of said inductive means;

a differential Q compensation circuit providing extra negative impedance to further compensate for the resistance of said inductive means of said differential series LC resonator, said differential Q compensation circuit comprising a cross-coupled differential third and fourth transistor, the drain of said third and fourth transistor coupled to the source of said first and said second transistor, respectively, and a tunable current source coupled between said third port and the source of said third and said fourth transistor, said tunable current source comprising an analog multiplier, two voltage controlled current sources and a fixed current source, said tunable current source improving the image rejection of said notch filter in a wide frequency band by providing for said Q-enhancement circuit a bias current which is the quadratic function of the tuning voltage across said tunable varactor means.

21. The notch filter of claim 20, wherein said first cascoded LNA is a differential LNA with a differential input and a differential output.

22. The notch filter of claim 20, wherein said second cascoded LNA is a differential LNA with a differential input and a differential output.

23. The notch filter of claim 20, wherein said inductive means of said LC resonator is an on-chip low Q inductor.

24. The notch filter of claim 20, wherein said capacitive means of said LC resonator are used to adjust the frequency distance between poles and zeros of said notch filter.

25. The notch filter of claim 20, wherein adjustment of the transconductance $g_m$ of said first and said second transistor of said LC resonator increases the quality factor Q of said inductive means of said LC resonator.

26. The notch filter of claim 20, wherein changes of said bias current change the value of the negative resistance of said Q-enhancement circuit.

27. The notch filter of claim 20, wherein said Q-enhancement circuit operates in the range from 2 to 5 GHz (GHz=$10^9$ Hz).

28. The notch filter of claim 20, wherein said Q-enhancement circuit has an image rejection ranging from 55 to 65 dB in Bluetooth applications.

29. The notch filter of claim 20, wherein said Q-enhancement circuit has an image frequency tuning range of 100 MHz (MHz=$10^6$ Hz) in Bluetooth applications.

30. A wideband tunable high Q image rejection notch filter comprising:
a first cascoded LNA having an input and an output, said first cascoded LNA receiving an RF input signal at said input and providing at its output an amplified signal of said RF input signal;
a second cascoded LNA having an input and an output, said second cascoded LNA input coupled to said output of said first LNA, said second LNA rejecting on-chip common-mode noise;
a Q-enhancement circuit coupled to said second cascoded LNA, said Q-enhancement circuit used in a notch filter by creating a negative resistance to compensate for resistive losses in inductive components of said Q-enhancement circuit, said Q-enhancement circuit comprising:
a differential series LC resonator comprising a first and a second transistor, where the source and the drain of said first and said second transistor are paralleled by a first and a second capacitive means, respectively, where a first and a second inductive means is coupled across the gate and the drain of said first and said second transistor, respectively, where the drains of said first and said second transistor are coupled to said second cascoded LNA, where the sources of said first and said second transistor are coupled together via capacitance means, where the source and gate of said first transistor is coupled via first and second terminals of a first capacitance tunable varactor means, where the source and gate of said second transistor is coupled via first and second terminals of a second capacitance tunable varactor means, and where a third terminal of said first and said second capacitance tunable varactor means is coupled to a third port providing an input signal, said varactors extending the notch frequency band of said Q-enhancement circuit, and where said differential series LC resonator is a transconductor based negative resistance generator resonating at the image frequency to compensate for the resistance of said inductive means;

a differential Q compensation circuit providing extra negative impedance to further compensate for the resistance of said inductive means of said differential series LC resonator, said differential Q compensation circuit comprising a cross-coupled differential third and fourth transistor, the drain of said third and fourth transistor coupled to the source of said first and said second transistor, respectively, and a current source coupled between a reference voltage and the source of said third and said fourth transistor, said current source providing a bias current for said Q-enhancement circuit.

31. The notch filter of claim 30, wherein said first cascoded LNA is a differential LNA with a differential input and a differential output.

32. The notch filter of claim 30, wherein said second cascoded LNA is a differential LNA with a differential input and a differential output.

33. The notch filter of claim 30, wherein said inductive means of said LC resonator is an on-chip low Q inductor.

34. The notch filter of claim 30, wherein said first and said second capacitive means of said LC resonator are used to adjust the frequency distance between poles and zeros of said notch filter.

35. The notch filter of claim 30, wherein adjustment of the transconductance $g_m$ of said first and said second transistor of said LC resonator increases the quality factor Q of said inductive means of said LC resonator.

36. The notch filter of claim 30, wherein changes in said bias current change the value of the negative resistance of said Q-enhancement circuit.

37. The notch filter of claim 30, wherein said Q-enhancement circuit operates in the range from 2 to 5 GHz (GHz=$10^9$ Hz).

38. The notch filter of claim 30, wherein said Q-enhancement circuit has an image rejection ranging from 35 to 50 dB.

39. The notch filter of claim 30, wherein said Q-enhancement circuit has an image frequency tuning range of 200 MHz (MHz=$10^6$ Hz) in Bluetooth applications.

40. The notch filter of claim 30, wherein said Q-enhancement circuit has an image frequency tuning range of 350 MHz (MHz=$10^6$ Hz) in Wireless LAN applications.

41. A wideband tunable high Q image rejection notch filter comprising:

a single ended cascoded LNA having an input and a single output, said single ended cascoded LNA receiving an RF input signal at said single input and providing at said single output an amplified signal of said RF input signal;

a differential cascoded LNA having a single input and a differential output, said single input of said differential cascoded LNA coupled to said single output of said single ended cascoded LNA, said differential cascoded LNA rejecting on-chip common-mode noise;

a Q-enhancement circuit coupled to said differential cascoded LNA, said Q-enhancement circuit used in a notch filter by creating a negative resistance to compensate for resistive losses in inductive components of said Q-enhancement circuit, said Q-enhancement circuit comprising:

a differential series LC resonator comprising a first and a second transistor, where the source and the drain of said first and said second transistor are paralleled by a first and a second capacitive means, respectively, where a first and a second inductive means is coupled across the gate and the drain of said first and said second transistor, respectively, where the drains of said first and said second transistor are coupled to said second cascoded LNA, where the sources of said first and said second transistor are coupled together via a first and a second terminal of a capacitance tunable varactor means, where a third terminal of said capacitance tunable varactor means is coupled to a reference potential, and where the drain of said first and said second transistor is coupled via capacitive means to the gate of said first and said second transistor, respectively, where said differential series LC resonator is a transconductor based negative resistance generator resonating at the image frequency to compensate for the resistance of said inductive means;

a differential Q compensation circuit providing extra negative impedance to further compensate for the resistance of said inductive means of said differential series LC resonator, said differential Q compensation circuit comprising a cross-coupled differential third and fourth transistor, the drain of said third and fourth transistor coupled to the source of said first and said second transistor, respectively, and a current source coupled between said reference voltage and the source of said third and said fourth transistor, said current source providing a bias current for said Q-enhancement circuit.

42. The notch filter of claim 41, wherein said inductive means of said LC resonator is an on-chip low Q inductor.

43. The notch filter of claim 41, wherein said capacitive means of said LC resonator are used to adjust the frequency distance between poles and zeros of said notch filter.

44. The notch filter of claim 41, wherein adjustment of the transconductance $g_m$ of said first and said second transistor of said LC resonator increases the quality factor Q of said inductive means of said LC resonator.

45. The notch filter of claim 41, wherein changes of said bias current change the value of the negative resistance of said Q-enhancement circuit.

46. The notch filter of claim 41, wherein said Q-enhancement circuit operates in the range from 2 to 5 GHz (GHz=$10^9$ Hz).

47. The notch filter of claim 41, wherein said Q-enhancement circuit has an image rejection ranging from 60 to 70 dB in Bluetooth applications.

48. The notch filter of claim 41, wherein said Q-enhancement circuit has an image frequency tuning range of 200 MHz (MHz=$10^6$ Hz) in Bluetooth applications.

* * * * *